United States Patent
Kao et al.

(10) Patent No.: US 8,621,720 B2
(45) Date of Patent: Jan. 7, 2014

(54) INJECTION MOLDED OBJECT WITH COUPLING ELEMENT IMPLANTED THEREIN, AND INJECTION MOLD FOR MANUFACTURING THE OBJECT

(75) Inventors: Chao-Chieh Kao, New Taipei (TW); Ying-Huang Liu, Taipei (TW); Wei-Yu Liu, New Taipei (TW); Sheng-Wen Wu, Keelung (TW)

(73) Assignee: Quanta Computer Inc., Taoyuan Shien (TW)

( * ) Notice: Subject to any disclaimer, the term of this patent is extended or adjusted under 35 U.S.C. 154(b) by 356 days.

(21) Appl. No.: 13/064,762

(22) Filed: Apr. 13, 2011

(65) Prior Publication Data

US 2012/0110783 A1    May 10, 2012

(30) Foreign Application Priority Data

Nov. 5, 2010    (TW) ............................... 99138143 A

(51) Int. Cl.
*A47J 45/07*    (2006.01)
*A45C 13/26*    (2006.01)

(52) U.S. Cl.
USPC .............................. 16/444; 16/114.1; 16/431

(58) Field of Classification Search
USPC ............ 16/444, 445, 436, 423, 425, DIG. 12, 16/DIG. 19; 220/771, 760, 756, 757, 759, 220/762–765, 769, 773, DIG. 14, DIG. 12; 206/142, 143; 190/115
See application file for complete search history.

(56) References Cited

U.S. PATENT DOCUMENTS

| | | | | |
|---|---|---|---|---|
| 2,146,415 A * | 2/1939 | Bradley | ......................... | 220/753 |
| 3,656,594 A * | 4/1972 | Marks et al. | ..................... | 16/408 |
| 3,737,944 A * | 6/1973 | Szabo et al. | ..................... | 16/430 |
| 3,813,729 A * | 6/1974 | Szabo et al. | ..................... | 16/408 |
| 4,261,078 A * | 4/1981 | Edwards et al. | ................. | 16/409 |
| 4,335,487 A * | 6/1982 | DiPierro et al. | ................. | 16/445 |
| 4,340,990 A * | 7/1982 | Seynhaeve | ................... | 16/445 |
| 4,364,150 A * | 12/1982 | Remington | .................... | 16/409 |
| D270,810 S * | 10/1983 | Stolarz | ........................... | D8/317 |
| 5,303,451 A * | 4/1994 | Graviss et al. | ................. | 16/412 |
| 5,687,867 A * | 11/1997 | Lamoureux | .................... | 215/303 |
| 5,771,536 A * | 6/1998 | Sieg et al. | ....................... | 16/431 |
| 6,000,097 A * | 12/1999 | Russell | ....................... | 16/114.1 |
| 6,014,850 A * | 1/2000 | LeMire | ........................ | 53/134.1 |
| 6,049,945 A * | 4/2000 | Prevot et al. | ................. | 16/110.1 |
| 6,176,423 B1 * | 1/2001 | Egami | ............................ | 235/379 |
| 6,223,397 B1 * | 5/2001 | Prevot et al. | .................... | 16/444 |
| 6,437,939 B1 * | 8/2002 | Smith | ........................ | 360/99.13 |
| 6,658,698 B2 * | 12/2003 | Chen | ............................ | 16/114.1 |
| D631,288 S * | 1/2011 | Grasso et al. | ................. | D7/394 |
| 2005/0224536 A1* | 10/2005 | Moses | ............................ | 224/201 |
| 2007/0245521 A1* | 10/2007 | Chehebar | ..................... | 16/114.1 |

FOREIGN PATENT DOCUMENTS

JP    2001037523 A  *  2/2001

* cited by examiner

*Primary Examiner* — Chuck Mah
(74) *Attorney, Agent, or Firm* — Rabin & Berdo, P.C.

(57) ABSTRACT

A coupling element, an injection molding object with the coupling element implanted therein, and an injection mold for manufacturing the injection molding object are provided. The coupling element has two reversely extended fixing ribs. The injection mold has a first mold and a second mold. The first mold has a first molding cavity and two positioning blocks separated by the first molding cavity. The second mold has a second molding cavity. When the first mold and the second mold are shut together and their molding cavities combine to define a closed room, the positioning blocks hold the coupling element by clamping the fixing ribs so the coupling element is suspended in midair of the closed room.

9 Claims, 13 Drawing Sheets

INJECTION MOLDED OBJECT WITH COUPLING ELEMENT IMPLANTED THEREIN, AND INJECTION MOLD FOR MANUFACTURING THE OBJECT

RELATED APPLICATIONS

This application claims priority to Taiwanese Application Serial Number 099138143, filed Nov. 5, 2010, which is herein incorporated by reference.

BACKGROUND

1. Technical Field

The present invention relates to an injection mold, more particular to an injection mold for injecting plastic material to envelop a solid object in the injection mold.

2. Description of Related Art

At present, an educational computer for kids normally furnishes a holding handle thereon. The holding handle is provided with two coupling elements partially implanted at two opposite ends of the holding handle therein so that a connecting part of each coupling element is exposed from the holding handle for connecting with a spring of the educational computer at the corresponding position.

One of the methods for making the holding handle is with steps of providing two coupling elements; then, placing the coupling elements into a molding cavity of an injection mold; next, injecting plastic material to envelop the coupling elements in the injection mold, and after cooling, the plastic material is solidified to finally form a holding handle.

However, during the injecting step, in order to mostly envelope the coupling element inside the injected plastic material and expose its connecting part from the injected plastic material only, each of the coupling elements needs to be suspended in midair of the inner space of the molding cavity and not to contact with the inner surfaces of the molding cavity at all. Therefore, after the coupling element is enveloped in the plastic material and the plastic material is solidified, nowhere of the coupling element is exposed outside the surface of the holding handle.

In practice, a traditional way is to extend pen-like pins upwardly and downwardly from both an upper mold and a lower mold to fix the coupling element by pushing the opposite sides of the coupling element so as to enable the coupling element to suspend in the midair of the molding cavity.

Consequently, after the holding handle is formed, due to the pen-like pins, the opposite sides of the holding handle respectively remain some depressed holes or areas so as to further remain bad looking issues.

SUMMARY

The present invention discloses a coupling element and an injection mold for making an injection molding object, so as to provide a novel way capable of supporting the coupling element to be suspended in midair of the inner space of the injection mold to further improve the bad looking issues mentioned above.

The injection mold is used for injecting plastic material to partially envelop a coupling element. The coupling element is provided with a connecting hole at one end thereof and two fixing ribs extended reversely with each other. The injection mold comprises a first mold and a second mold. The first mold comprises a first molding cavity, a location pin and two positioning blocks. The first molding cavity is installed on a surface of the first mold and used for accommodating the coupling element. The location pin is installed in the first molding cavity, and used for passing through the connecting hole. The positioning blocks are installed on the surface of the first mold, and separated by the first molding cavity. The second mold comprises a second molding cavity. The second molding cavity is installed on a surface of the second mold and arranged correspondingly to the first molding cavity.

Thus, when the first mold and the second mold are shut together and the first molding cavity and the second molding cavity are combined into a closed room for receiving the filled plastic material, the positioning blocks hold the coupling element therebetween by clamping the fixing ribs of the coupling element thereby the coupling element is suspended in midair of the closed room.

The coupling element provided in the present invention is for being placed in an injection mold so as to be implanted in a plastic body. The coupling element comprises a main body, a lug and two fixing ribs. The main body is provided with a lengthwise shape. The lug is disposed at one end of the main body, and the lug is provided with a connecting hole for being fixed in the injection mold.

The fixing ribs are respectively disposed on two opposite lengthwise sides of a surface of the main body, and extended reversely with each other, and used for supporting the main body to be suspended in midair of an inner space of the injection mold.

The injection molding object provided in the present invention comprises a plastic body, a plate and two coupling elements. The plastic body comprises a first plastic portion and two second plastic portions. The first plastic portion is with a lengthwise shape, and is provided with an exposing opening at one surface thereof. The second plastic portions is with a lengthwise shape, and respectively disposed at two opposite ends of the first plastic portion, and extended reversely with each other. Each of the second plastic portions is provided with two slits on two opposite lengthwise sides of the second plastic portion, respectively. The plate is embedded in the first plastic portion. The plate comprises a protrusive plane and a circled fillister. The protrusive plane is disposed on one surface of the plate, and is exposed outwardly from the first plastic portion through the exposing opening. The circled fillister surrounds the protrusive plane, and is arranged between the protrusive plane and the first plastic portion, and is exposed outwardly from the first plastic portion through the exposing opening. The coupling elements are respectively implanted in the second plastic portions one on one. Each of the coupling elements comprises a lug and two exposed parts. The lug is disposed at one end of the coupling element, and is exposed outwardly from one free end of the second plastic portion. The exposed parts are respectively exposed outward the second plastic portion through the slits one on one.

As mentioned above, in the present invention, by holding the fixing ribs of the coupling element, each main body of the coupling element keeps distances from both the first mold and the second mold. Thus, the present invention eliminates the traditional solution which uses two sets of pen-like pins to respectively extend upwardly and downwardly to press against the two opposite surfaces of the coupling element so as to prevent from bad looking depressed holes left on the holding handle, and to further decease the bad looking issues happened.

BRIEF DESCRIPTION OF THE DRAWINGS

The present invention will be apparent to those skilled in the art by reading the following detailed description of a preferred embodiment thereof, with reference to the attached drawings, in which.

DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

For the bad looking issues, a coupling element, an injection molding object with the coupling element implanted therein, and an injection mold for manufacturing the injection molding object are provided in the present invention. By holding two fixing ribs extended from two opposite sides of the coupling element, the present invention can prevent the finished handle from remaining the depressed holes on the two opposite surfaces thereof so as to solve the bad looking issues.

Figure 1:
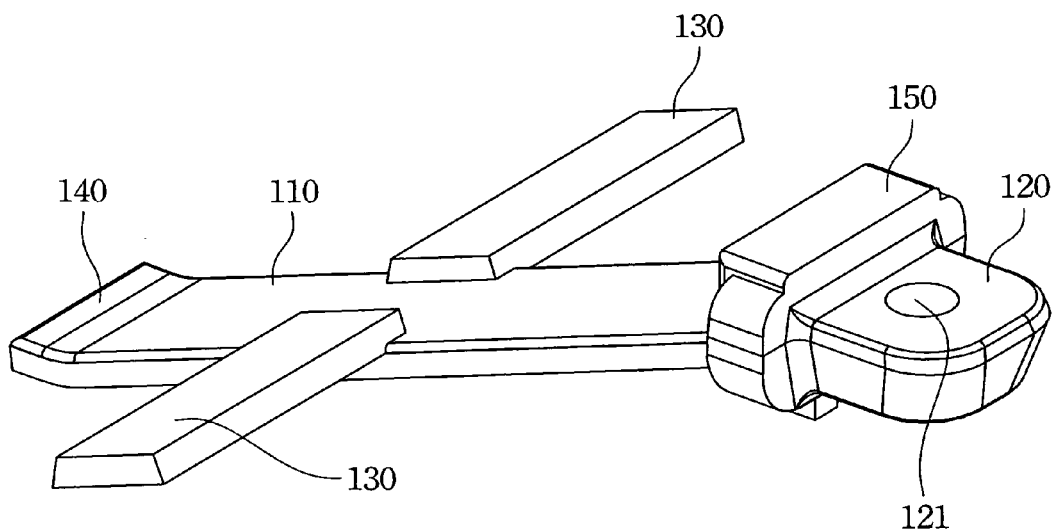
FIG. 1 is a perspective view showing a coupling element according to one embodiment of the present invention.

Refer to FIG. 1 in which FIG. 1 is a perspective view showing a coupling element according to one embodiment of the present invention. The coupling element provided in the embodiment is for being placed in an injection mold so the coupling element can be partially enveloped by injected plastic material which can be formed as a plastic body after cooling.

In the embodiment, the coupling element 100 comprises a main body 110, a lug 120 and two fixing ribs 130. The main body 110 is with a lengthwise shape having a first end and a second end opposite with the first end. The lug 120 is disposed at the first end of the main body 110, and penetrated with a connecting hole 121 thereon. The two fixing ribs 130 are respectively disposed on two opposite lengthwise sides of the main body 110, and extended reversely with each other.

Specifically, each of the fixing ribs 130 in this embodiment can be a straight plate. The two fixing ribs 130 are symmetrically disposed on two opposite lengthwise sides of a surface of the main body 110, and are extended horizontally towards two opposite directions from the opposite lengthwise sides of the main body 110, respectively.

In the embodiment, the coupling element 100 further comprises a plastic-grabbing portion 140. The plastic-grabbing portion 140 is disposed at the second end of the main body 110. The plastic-grabbing portion 140 is with a curved shape for increasing the connecting strength to the plastic body after enveloped by the plastic body.

Furthermore, the coupling element 100 further comprises a connecting portion 150. The connecting portion 150 is arranged between the main body 110 and the lug 120. A cross-section area of the connecting portion 150 is greater than a cross-section area of the main body 110 and a cross-section area of the lug 120.

In the present invention, the coupling element 100 is not limited to be made by any kinds of methods, such as an injection molding method, in this case, the material of the coupling element can be high density polyethylene (HDPE), Polypropylene (PP), Acrylonitrile Butadiene Styrene (ABS), NYLON or the combination thereof. Otherwise, the coupling element 100 can be made by a metal casting method; in this case, the coupling element is made of metal, such as aluminum, copper, tin or iron.

It needs to be noted that the two fixing ribs 130 also can be represented on the coupling element 100 in any other formations (e.g. column shape), or the two fixing ribs 130 also can be non-symmetrically arranged, e.g. in staggered arrangement, on the opposite lengthwise sides of the main body 110, as long as the two fixing ribs 130 support the main body 110 to be suspended in midair of the space in the injection mold 200.

Figure 2A:
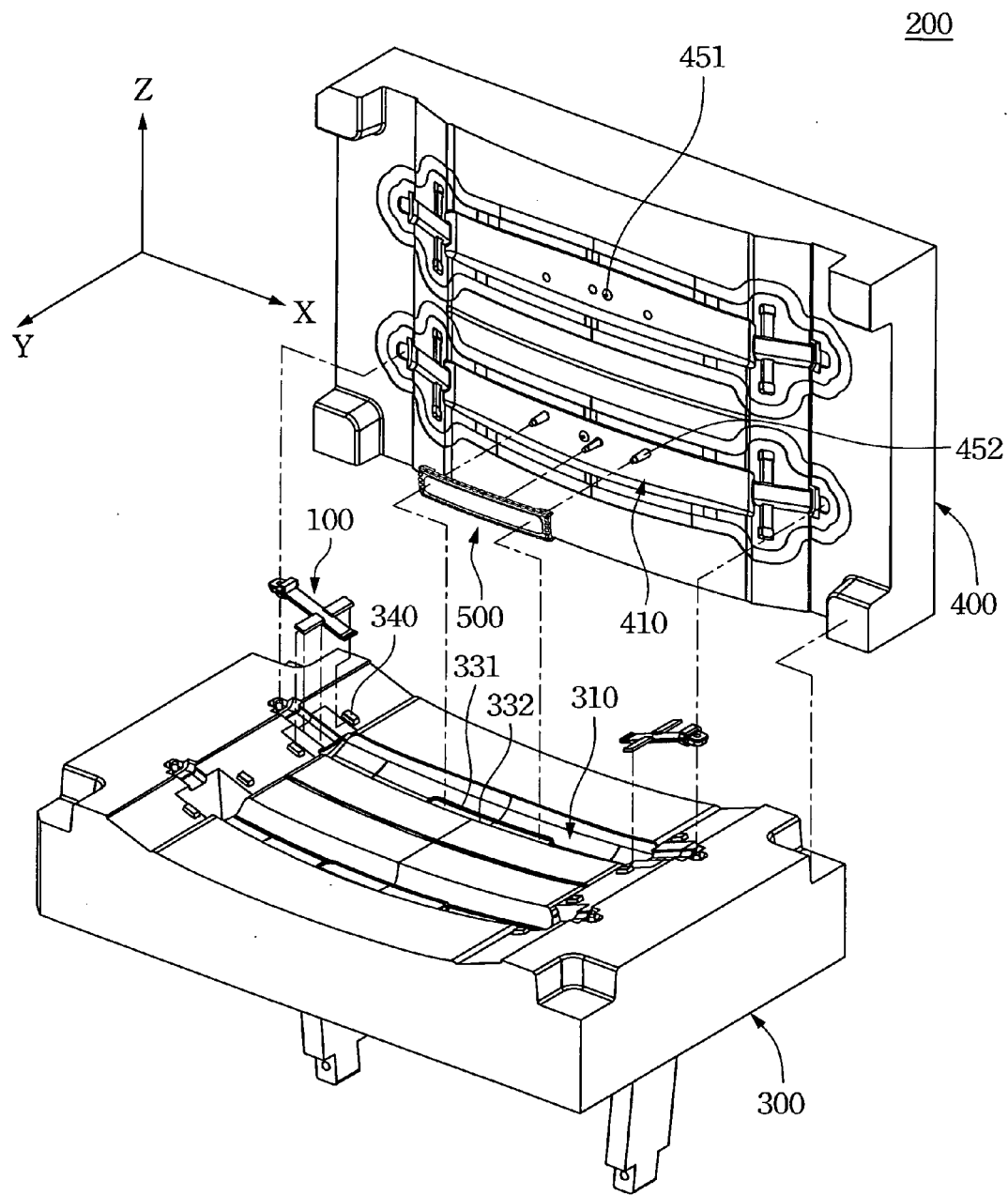
FIG. 2A is an exploded view showing an injection mold under an open status, the plate and the coupling element according to the embodiment of the present invention.

Refer to FIG. 2A in which FIG. 2A is an exploded view showing an injection mold 200 under an open status, the plate 500 and the coupling element 100 according to the embodiment of the present invention.

The injection mold 200 at least includes a first mold 300 and a second mold 400 which are able to open apart or shut together. The first mold 300, e.g. male die, includes a first molding cavity 310 and a number of positioning blocks 340. The second mold 400, e.g. female die, includes a second molding cavity 410 arranged correspondingly to the first molding cavity 310.

Figure 2B:
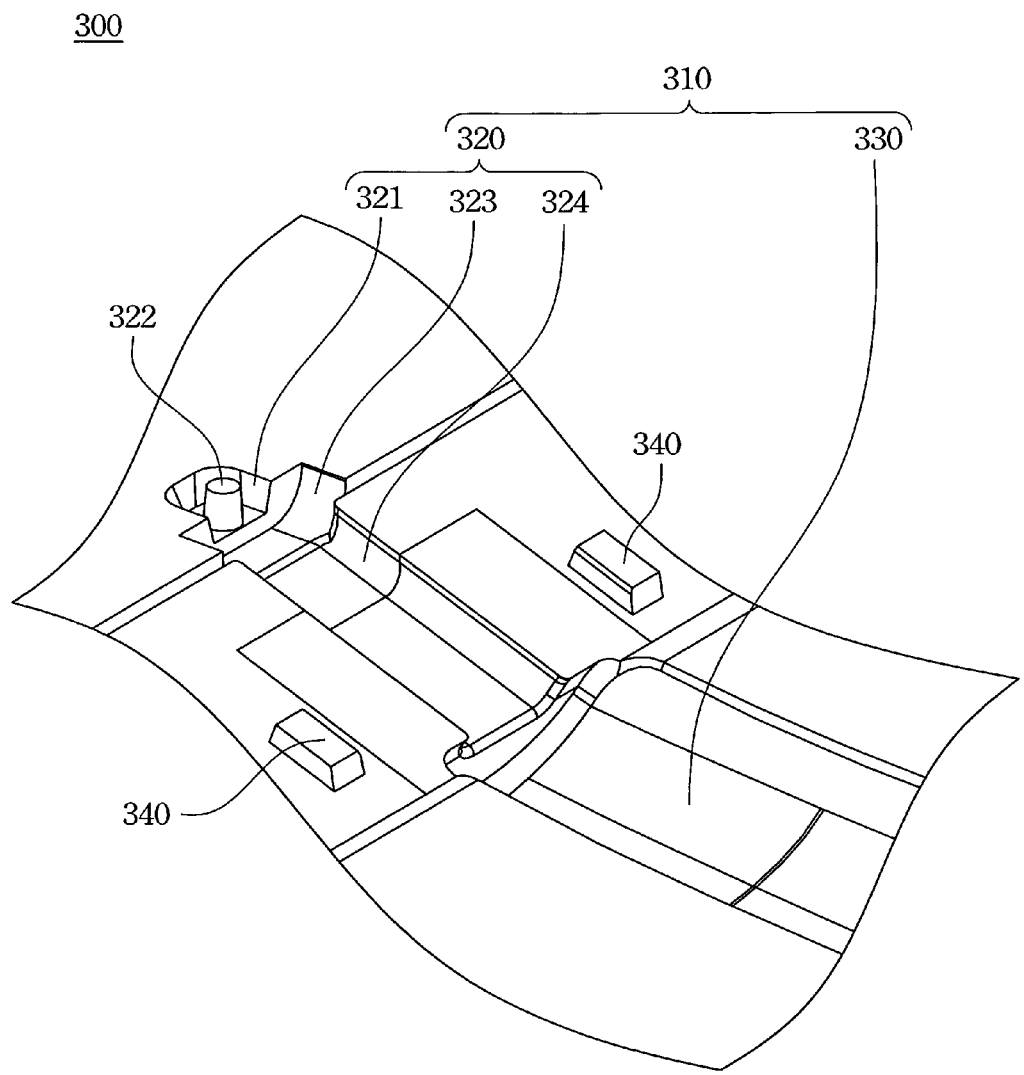
FIG. 2B is a partial enlargement view showing a first forming recess of FIG. 2A.

Refer to FIG. 2A and FIG. 2B in which FIG. 2B is a partial enlargement view showing a first forming recess 320 of FIG. 2A. Specifically, the first molding cavity 310 has a lengthwise shape, and concavely installed on a surface of the first mold 300. The first molding cavity 310 includes two first forming recesses 320 and a second forming recess 330 arranged between the first forming recesses 320. The two first forming recesses 320 are located at two opposite ends of the first molding cavity 310, and each first forming recess 320 is for accommodating the bottom half part of the main body 110, the connecting portion 150 and the lug 120 of the coupling elements 100.

Particularly, each of the first forming recesses 320 sequentially includes a first area 321, a second area 323 and a third area 324 according to a direction from the first forming recess 320 towards the second forming recess 330. The first area 321 is disposed on one end of the first forming recess 320 away from the second forming recess 330, and provided with a location pin 322 convexly installed on an inner bottom surface of the first area 321 of the first forming recesses 320. The location pin 322 is corresponding to the connecting hole 121 of the coupling element 100 for passing through the connecting hole 121.

Furthermore, the positioning blocks 340 are convexly installed on a surface of the first mold 300 respectively. In one of variations, two of the positioning blocks 340 are symmetrically disposed at two opposite sides of the first molding cavity 320, respectively. Namely, the first molding cavity 320 is arranged between the two positioning blocks 340 (FIG. 2B).

Figure 2C:
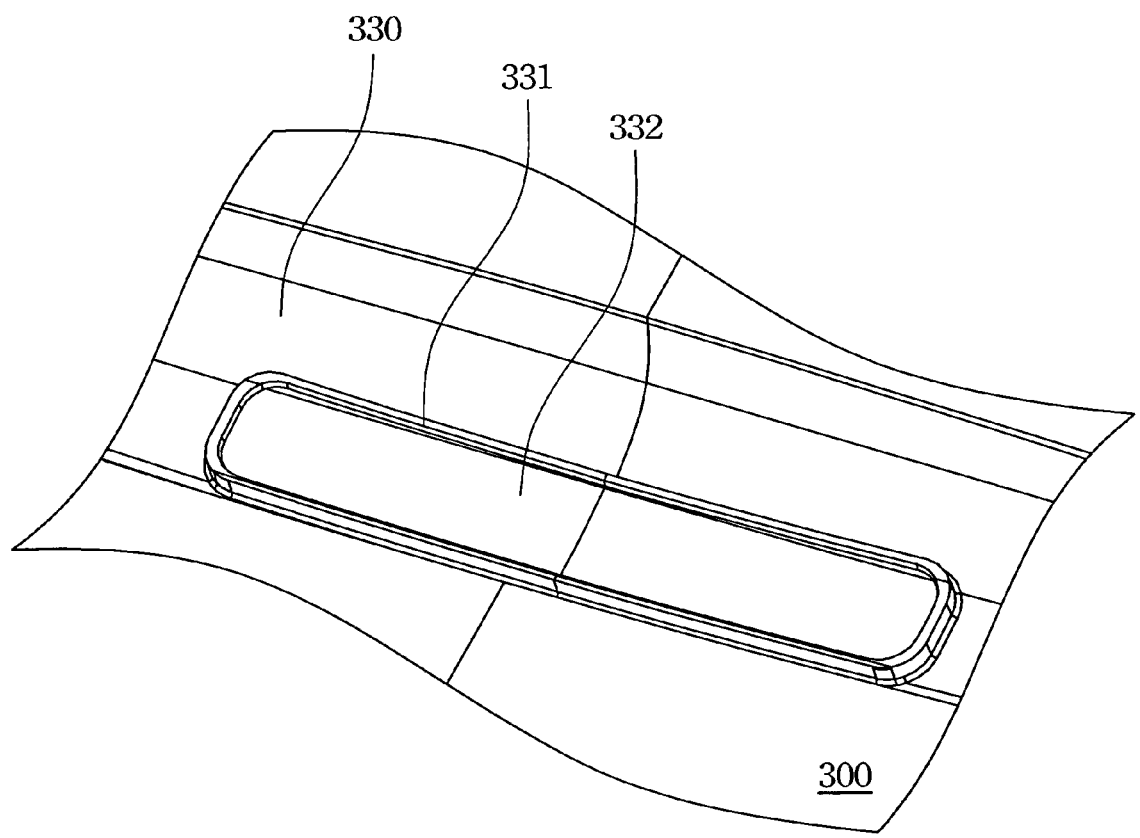
FIG. 2C is a partial enlargement view showing a second forming recess of FIG. 2A.

Refer to FIG. 2C in which FIG. 2C is a partial enlargement view showing a second forming recess of FIG. 2A. The second forming recess 330 is arranged between the two first forming recesses 320 (i.e. the opposite ends of the first molding cavity 310) and communicated with the two first forming recesses 320 (FIG. 2B). The second forming recess 330 further comprises a ring-shaped flange 331 thereon. The ring-shaped flange 331, for example, can be presented in a round, ellipsoid, squared-ring (FIG. 2C) or other enclosed contour, so as to define a containing space 332 with the second forming recess 330.

In another embodiment, for cooperating with the fixing ribs with non-symmetrical arrangement, two positioning blocks 340 are also arranged non-symmetrically (e.g. in staggered arrangement) on the surface of the first mold 300 at two opposite sides of the first forming recess 320 so as to correspondingly clamp the fixing ribs.

Figure 2D:
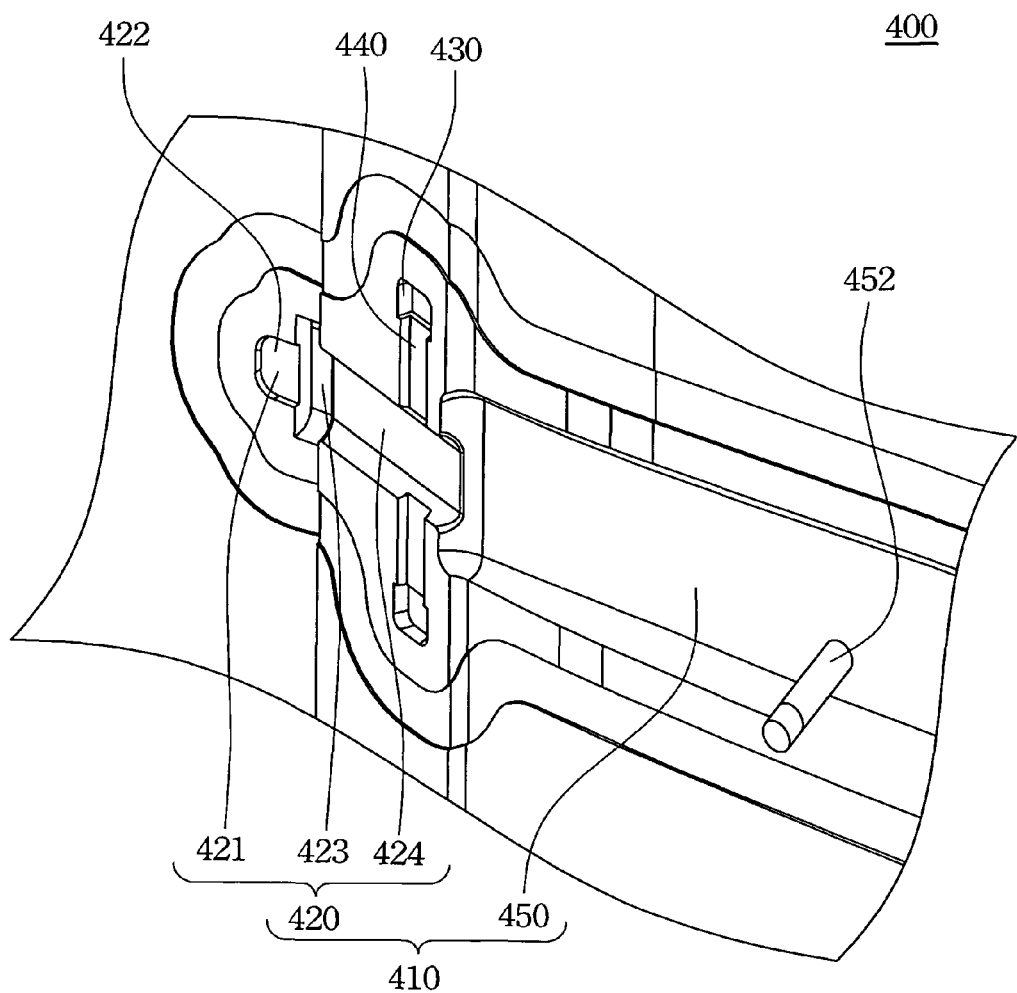
FIG. 2D is a partial enlargement view showing a third forming recess of FIG. 2A.

Refer to FIG. 2A and FIG. 2D in which FIG. 2D is a partial enlargement view showing a third forming recess 420 of FIG. 2A. The second molding cavity 410 is with a lengthwise shape, and concavely installed on a surface of the second mold 400 facing the first mold 300 in which the second molding cavity 410 is arranged correspondingly to the first molding cavity 310 (FIG. 2A).

The second molding cavity 410 includes two third forming recesses 420 and one fourth forming recess 450. The third forming recesses 420 are respectively located at two opposite ends of the second molding cavity 410, and arranged correspondingly to the first forming recess 320 of the first molding cavity 310. Each third forming recess 420 is for accommodating the upper half part of the main body 110, the connecting portion 150 and the lug 120 of the coupling elements 100.

Particularly, each of the third forming recesses 420 sequentially includes a fourth area 421, a fifth area 423 and a sixth area 424 according to a direction from the third forming recess 420 towards the fourth forming recess 450.

The fourth area 421 is disposed on one end of the third forming recess 420 farest away from the fifth forming recess 450, and defined a contact surface 422 on an inner bottom surface of the fourth area 421 for contacting the fixing pin 322 and being pushed against by the fixing pin 322.

Additionally, the second mold 400 further includes a plurality of first containing recesses 430 and a plurality of second containing recesses 440. The first containing recesses 430 are respectively concavely installed on a surface of the second mold 400 facing the first mold 300. Two of the first containing recesses 430 are symmetrically arranged on the surface of the second mold 400 at two opposite sides of the sixth area 424 of the third forming recess 420. Each first containing recess 430 is arranged correspondingly to one of the positioning blocks 340, and served for accommodating the positioning block 340 exactly.

The second containing recesses 440 are respectively concavely installed on a surface of the second mold 400 facing the first mold 300. Two of the second containing recesses 440 are symmetrically arranged on the surface of the second mold 400 at two opposite sides of the sixth area 424 of the third forming recess 420, and both the two second containing recesses 440 are arranged between the two first containing recesses 430. Each of the second containing recesses 440 is served for accommodating one of the fixing ribs 130 exactly.

Refer to FIG. 2A to FIG. 2D again. The fourth forming recess 450 is arranged between the two third forming recesses 420 and communicated with the two third forming recesses 420 (FIG. 2D). The fourth forming recess 450 further comprises a plastic filling inlet 451 and a plurality of the fixing pins 452 therein. The plastic filling inlet 451 is capable of filling fluid-status plastic material into the fourth forming recess 450. The fixing pins 452 are shaped as a pen, and extended from a bottom surface of the fourth forming recess 450 outwards the second mold 400.

Figure 3A:
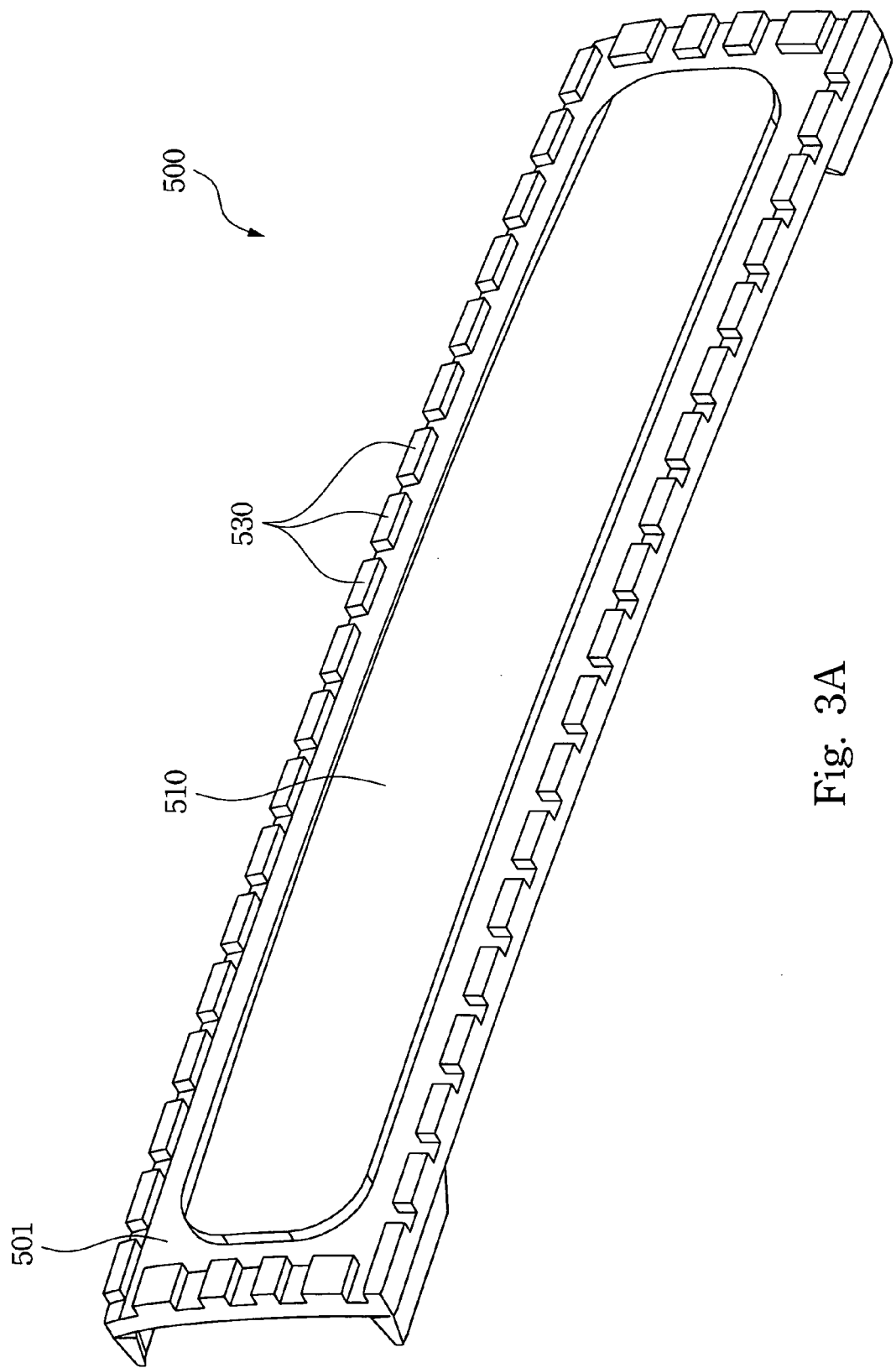
FIG. 3A is a schematic view showing the first surface of the plate according to one embodiment of the present invention.
Figure 3B:
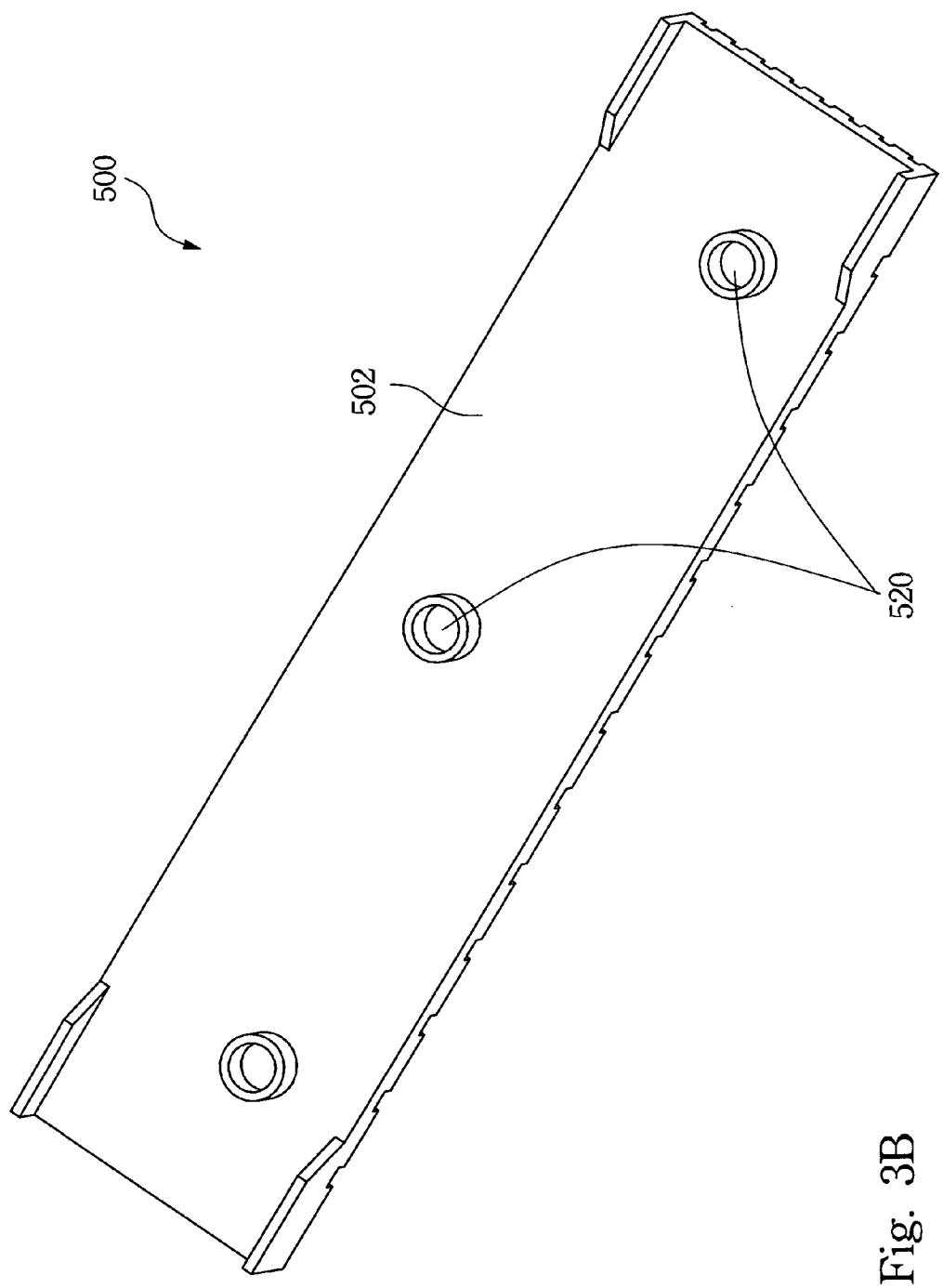
FIG. 3B is a schematic view showing the second surface of the plate according to the embodiment of FIG. 3A.

Refer to FIG. 2A, FIG. 3A and FIG. 3B in which FIG. 3A and FIG. 3B are schematic views showing two opposite surfaces of the plate 500 respectively according to one embodiment of the present invention.

The mentioned plate 500 includes a first surface 501, a second surface 502, a protrusive plane 510, and a plurality of holding depressions 520. The first surface 501 and the second surface 502 are oppositely arranged on two opposite surfaces of the plate 500. The protrusive plane 510 is convexly disposed on the first surface 501 of the plate 500, and the dimension and shape of the protrusive plane 510 are matched to the containing space 332 mentioned above (FIG. 2C). The holding depressions 520 are arranged on the second surface 502 wherein the location and the quantity of the holding depressions 520 are corresponding to the location and the quantity of the fixing pins 452.

Although the quantity of the holding depressions 520 is not limited in the present invention, however, when the quantity of the holding depressions 520 is more than three, the holding depressions 520 can be arranged in a non-linear arrangement, thus, so as the plate 500 can be ensured to place in the first molding cavity 310 correctly.

Also, the plate 500 further optionally includes a plurality of plastic-attaching portions 530 (FIG. 3A). The plastic-attaching portions 530 are respectively arranged separately on edges of the first surface 501 of the plate 500 so as to increase the attaching strength between the plastic-attaching portions 530 connecting to the plastic material.

Figure 4:
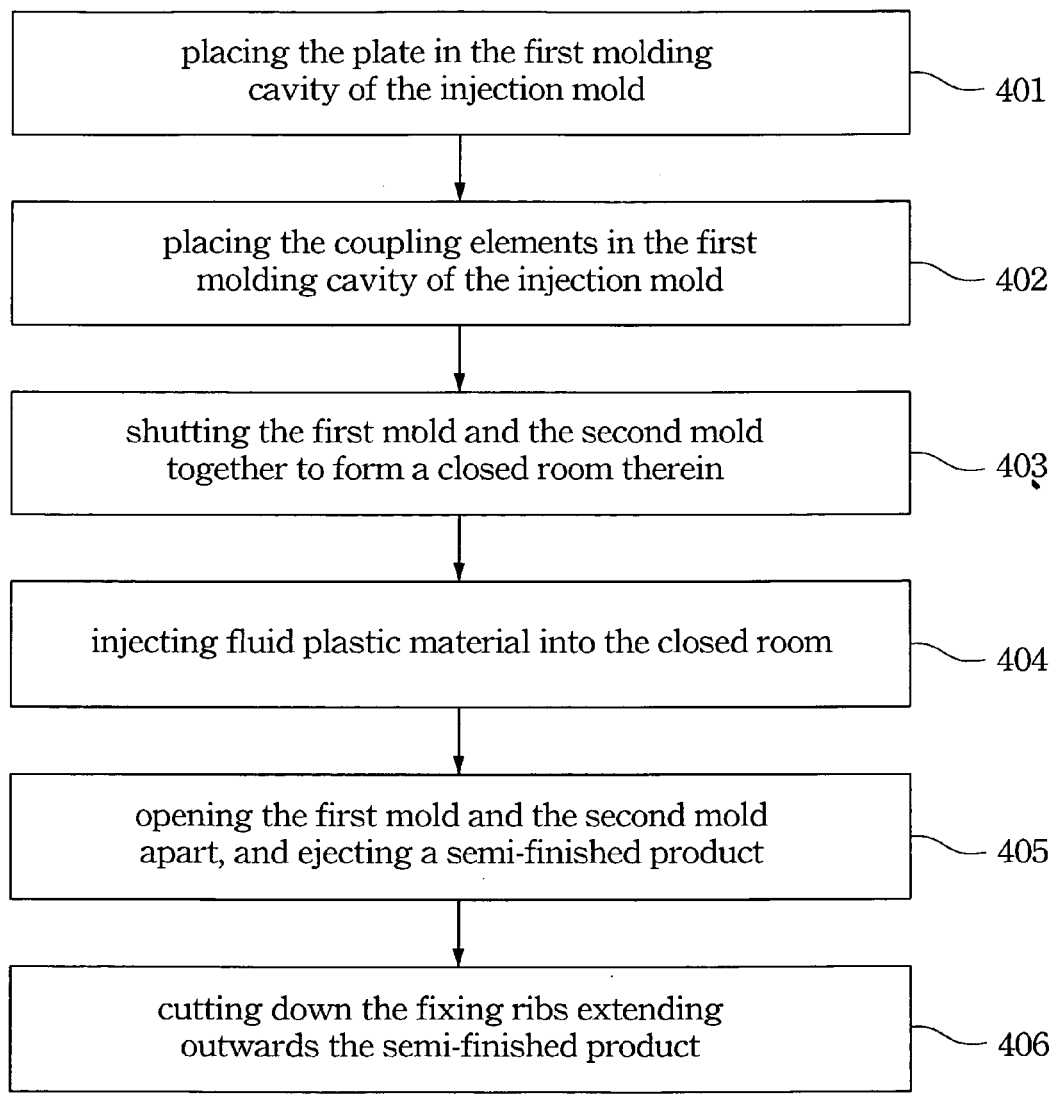
FIG. 4 is a flow chart showing a method of making an injection molding object by the injection mold of the present invention.

Refer to FIG. 4 in which FIG. 4 is a flow chart showing a method of making an injection molding object 700 (refer to FIG. 8) by the injection mold 200 of the present invention. When the method of making the injection molding object 700 is processed, the steps as follows:

Step (401) placing the plate 500 in the first molding cavity 310 of the injection mold 200 (FIG. 2A):

In this step, when the first mold 300 and the second mold 400 are opened apart, placing the plate 500 lying flat in the second forming recess 330 of the first molding cavity 310 in which the first surface 501 of the plate 500 is faced towards the second forming recess 330 of the first molding cavity 310 so that the protrusive plane 510 of the plate 500 is fit to insert into the containing space 332 of the ring-shaped flange 331 exactly. Therefore, the containing space 332 and the second forming recess 330 of the first molding cavity 310 at this step are not communicated with each other.

Step (402) placing the coupling elements 100 into the first molding cavity 310 of the injection mold 200 (FIG. 2A):

In this step, when placing each coupling element 100 lying flat into each first forming recess 320 of the first molding cavity 310, the lug 120, the connecting portion 150 and the main body 110 of the coupling element 100 are correspondingly placed into the first area 321, the second area 323 and the third area 324 respectively, and the connecting hole 121 of the lug 120 is passed through by the location pin 322, and the plastic-grabbing portion 140 of each coupling element 100 is extended into the second forming recess 330.

Meantime, the two fixing ribs 130 of each coupling element 100 are placed flat on the surface of the first mold 300, and are clamped by the corresponding positioning blocks 340.

In the present invention, the mentioned step (401) and step (402) above can be changed in order, namely, the priority of the mentioned step (401) and step (402) is not limited.

Figure 5:
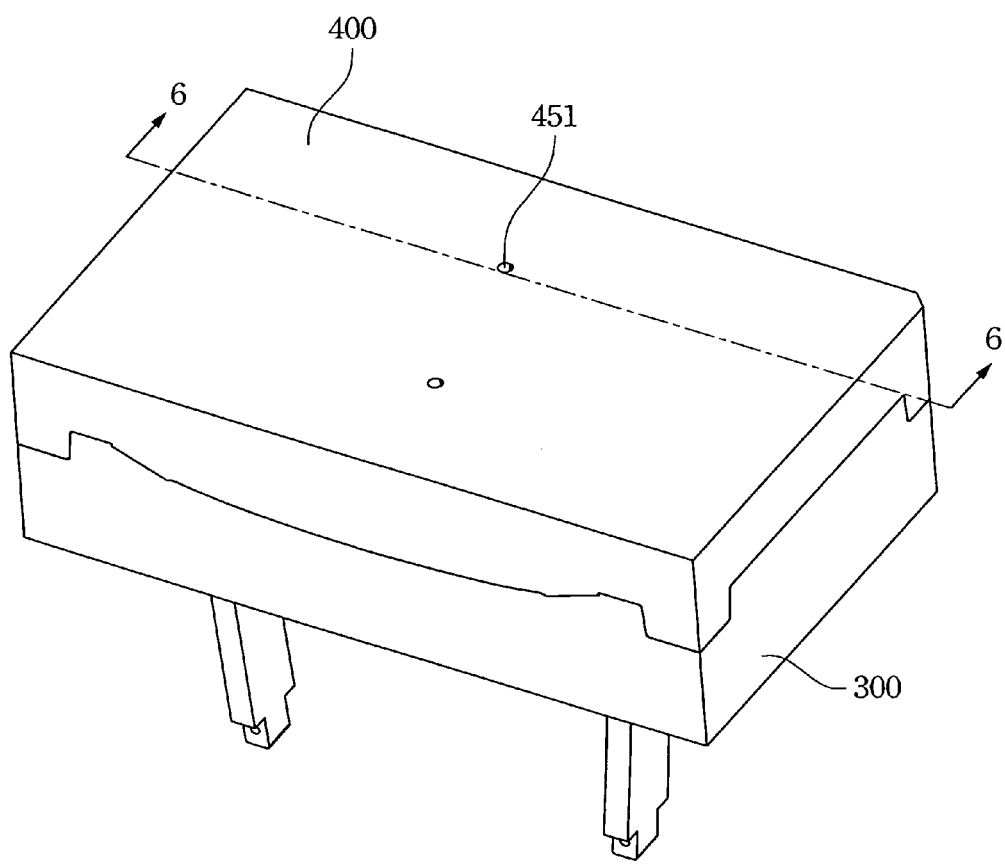
FIG. 5 is a perspective view showing the injection mold under a shut status according to the embodiment of the present invention.
Figure 6:
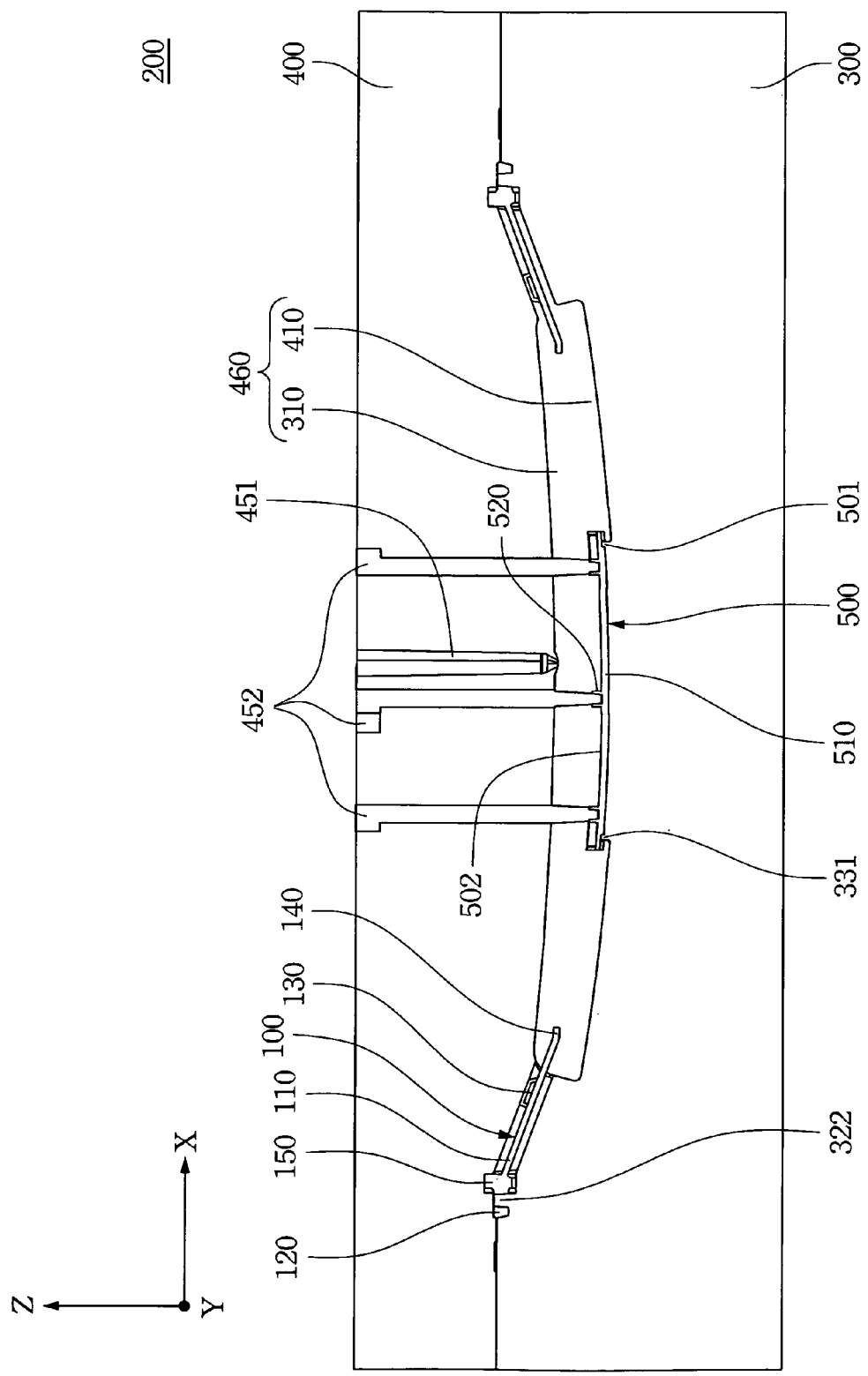
FIG. 6 is a cross-sectional view taken along line 6-6 of FIG. 5 before injecting the plastic material.

Step (403) shutting the first mold 300 and the second mold 400 together (FIG. 5):

Refer to FIG. 5 and FIG. 6 in which FIG. 5 is a perspective view showing the injection mold 200 under a shut status according to the embodiment of the present invention, and FIG. 6 is a cross-sectional view taken along line 6-6 of FIG. 5 before injecting the plastic material.

In this step, when the first mold 300 and the second mold 400 are shut together, the first molding cavity 310 and the second molding cavity 410 are combined to define a closed room 460 in which each first forming recess 320 of the first molding cavity 310 is communicated with the corresponding third forming recess 420 of the second molding cavity 410, and the second forming cavity 330 of the first molding cavity 310 is communicated with the corresponding fourth forming recess 450 of the second molding cavity 410.

Specifically, the fourth area 421, the fifth area 423 and sixth area 424 of each third forming recess 420 are respectively connected with the first area 321, the second area 323 and the third area 324 so as to accommodate the lug 120, the connecting portion 150 and the main body 110 of each coupling element 100, respectively. At the moment, each contact surface 422 of the second molding cavity 410 contacts the fixing pin 322 tightly.

Refer to FIG. 2A, FIG. 2D and FIG. 6 again. When the first mold 300 and the second mold 400 are shut together, the positioning blocks 340 are respectively contained in the first containing recesses 430 of the second molding cavity 410 completely, thus, the first containing recesses 430 is isolated to and not communicated with the closed room 460. Meanwhile, the fixing ribs 130 are respectively contained in the second containing recesses 440 of the second molding cavity 410 completely, thus, the second containing recesses 440 is isolated to and not communicated with the closed room 460 as well.

It needs to be emphasized that when the first mold 300 and the second mold 400 are shut together, since the two fixing ribs 130 of each coupling element 100 are clamped by the corresponding positioning blocks 340, the main body 110 of the coupling element 100 arranged between the two fixing ribs 130 is suspended in midair of the closed room 460, namely, the main body 110 is not contact with the inner surfaces of the first molding cavity 310 and the second molding cavity 410 at all.

Furthermore, when the first mold 300 and the second mold 400 are shut together, the fixing pins 452 in the fourth forming recess 450 will extend towards the second surface 502 of the plate 500, and insert into the corresponding holding depressions 520 respectively.

Thus, since the first surface 501 of the plate 500 is pressed by the top of the ring-shaped flange 331 and the second surface 502 of the plate 500 is pressed by the top of the fixing pins 452, thus, the plate 500 can be sandwiched between the ring-shaped flange 331 and fixing pins 452 so as to be positioned tightly in the closed room 460.

Step (404) injecting a quantity of fluid plastic material into the closed room 460 of the injection mold 200 so as to partially envelop the plate 500 and the coupling elements 100 (FIG. 6):

In this step, when a plastic material filling machine (not shown in figures) is activated to continually fill fluid plastic material into the closed room 460 via the plastic filling inlet 451. Then, the fluid plastic material flows around in the closed room 460 until the closed room 460 is fully filled.

After the fluid plastic material is cooled in the closed room 460, according to the shape of the closed room 460, the plastic material will be solidified into a plastic body 710 (FIG. 7) having a shape as same as the closed room 460. Besides, the plate 500 and the coupling elements 100 are partially enveloped in the plastic body 710 appropriately.

Since the connecting hole 121 of the lug 120 is passed through by the fixing pin 322, the main body 110 of each coupling element 100 can be hooked and not be flushed to move away along an X axle by the flowed plastic material. Also, since both the two fixing ribs 130 are clamped by the positioning blocks 340, the main body 110 of each coupling element 100 can be held and not be flushed to move away along a Y axle by the flowed plastic material. Furthermore, because the first mold 300 and the second mold 400 are shut together, the two fixing ribs 130 of each coupling element 100 are fixed in the corresponding second containing recesses 440 respectively, thus, the main body 110 of each coupling element 100 can be held and not be flushed to move away along a Z axle by the flowed plastic material. Meanwhile, since the plate 500 are sandwiched between the ring-shaped flange 331 and fixing pins 452, the plate will not be flushed to move away towards an unexpected direction.

Figure 7:
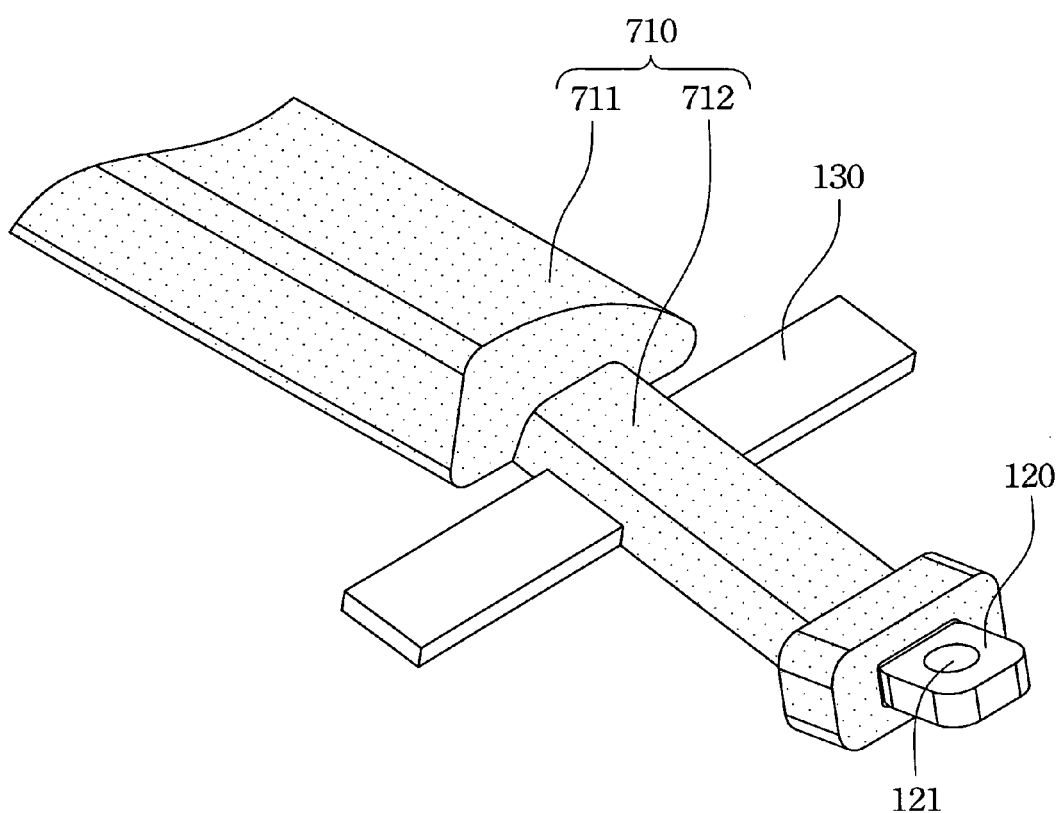
FIG. 7 is a partial schematic view showing a semi-finished product of the injection molding object after ejected from the injection mold of FIG. 2.

Step (405) opening the first mold 300 and the second mold 400 apart and ejecting a semi-finished product 600 (FIG. 7):

Refer to FIG. 7 in which FIG. 7 is a partial schematic view showing a semi-finished product of the injection molding object after ejected from the injection mold of FIG. 2.

After the plastic material is solidified to form the plastic body 710 (FIG. 7), the plastic body 710 mentioned above has enveloped the plate 500 and the coupling elements 100 partially (detailed description as below). However, because the second containing recesses 440 are respectively isolated with the closed room 460, each fixing rib 130 in the second containing recess 440 can not be enveloped by the plastic body 710. Consequently, the two fixing ribs 130 of each coupling element 100 respectively extend outwards two opposite sides of the plastic body 710. Also, the plastic body 710 with the fixing ribs 130 extending outwards the plastic body 710 is so far called a "semi-finished product 600".

Figure 8:
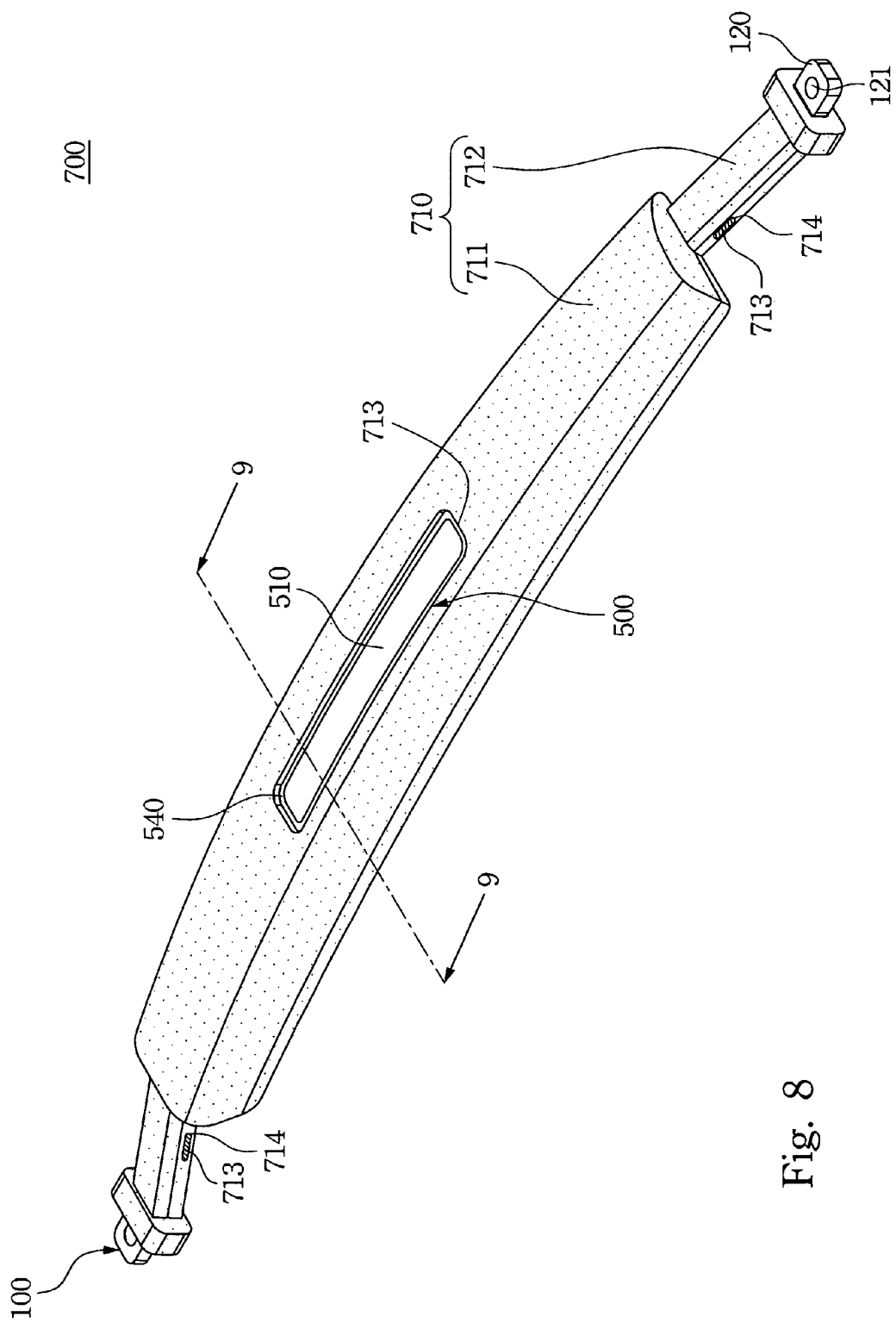
FIG. 8 is a perspective view showing a finished product of the injection molding object after the fixing ribs are removed from the semi-finished product of the injection molding object.

Step (406) cutting down the fixing ribs 130:

Refer to FIG. 8 in which FIG. 8 is a perspective view showing a finished product of the injection molding object after the fixing ribs 130 are removed.

In this step, the fixing ribs 130 extending outwards the semi-finished product 600 are respectively cut down to remove from the semi-finished product 600, so that a final injection molding object 700 is done.

In the present invention, since the fixing ribs 130 of the coupling element 100 for suspending the main body 110 in midair of the closed room 460 are significant to be arranged on two opposite longwise sides of the main body 110 respectively, therefore, the fixing ribs 130 respectively extend outwards the semi-finished product 600 on two opposite narrower sides of the semi-finished product 600 instead of wider sides of the semi-finished product 600 so as to relief the effect of bad appearance issue.

Figure 9:
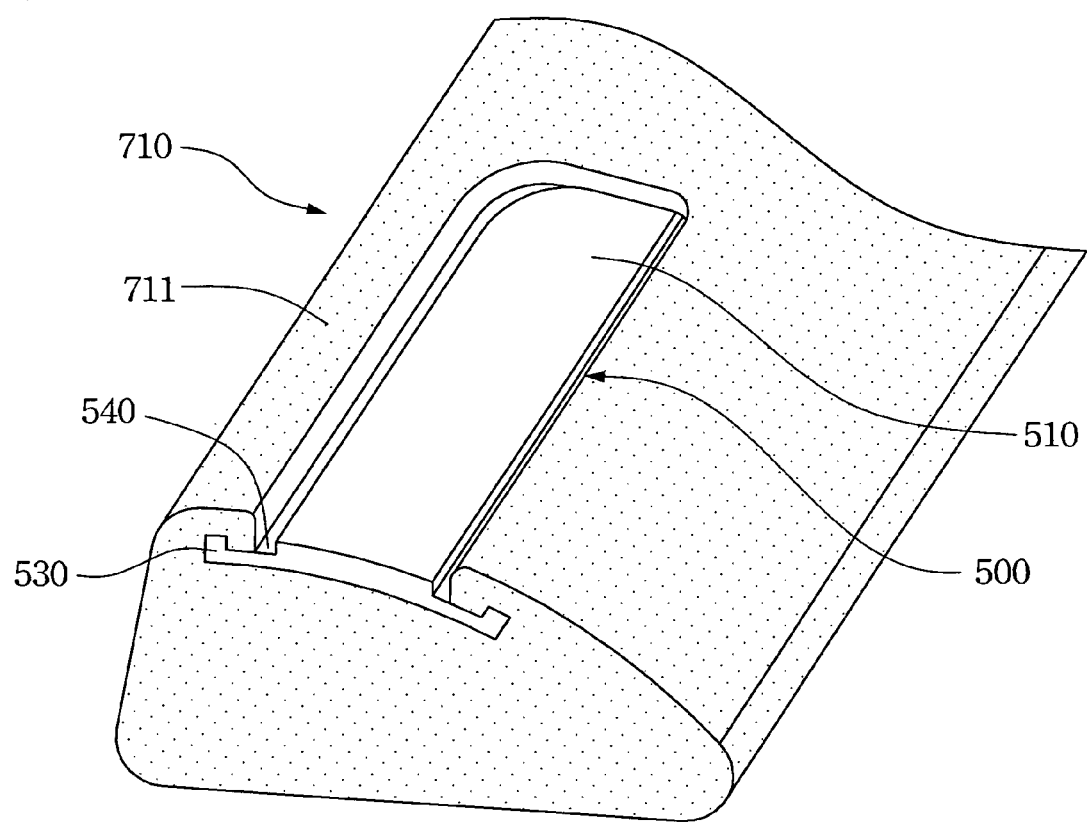
FIG. 9 is a sectional view taken along line 9-9 of FIG. 8.

Refer to FIG. 8 and FIG. 9 again in which FIG. 9 is a sectional view taken along line 9-9 of FIG. 8.

The final injection molding object 700 manufactured by the injection mold 200, essentially includes a plastic body 710, a mentioned plate 500 above, and two mentioned coupling elements 100 above. The plastic body 710 includes a first plastic portion 711 and two second plastic portions 712. The first plastic portion 711 is disposed between the two second plastic portions 712, and integrally connected the two second plastic portions 712. Also, the first plastic portion 711 is presented as a lengthwise shape, and is provided with an exposing opening 713 at one surface thereof. Each of the second plastic portions 712 is presented as a lengthwise shape, and has a cross sectional area which is smaller than that of the first plastic portion 711. The two second plastic portions 712 are reversely extended at two opposite ends of the first plastic portion 711.

Due to Step (406) of cutting down the fixing ribs 130, each of the second plastic portions 712 is provided with two slits 714 on two opposite lengthwise sides of the second plastic portion 712, respectively. Each slit 714 exposes a part of the coupling element 100 embedded in the second plastic portion 712.

The plate 500 is embedded in the first plastic portion 711. The protrusive plane 510 is exposed outwardly from the first plastic portion 711 through the exposing opening 713. The plate 500 further includes a circled fillister 540 (practically called decoration line in the industries). The circled fillister 540 surrounds the protrusive plane 510, is formed between the protrusive plane 510 and the first plastic portion 711, and exposed outwardly from the first plastic portion 711 through the exposing opening 713.

Each of the coupling elements 100 is partially implanted in the second plastic portion 712. Each lug 120 of the coupling element 100 is exposed outwardly from one free end of the second plastic portion 712. Due to Step (406) of cutting down the fixing ribs 130, two cutting marks (called exposed part 713) that the fixing ribs 130 are removed on the coupling elements 100 are symmetrically exposed outward two opposite longwise sides of the second plastic portion 712 through the slits 714, respectively.

It needs to be emphasized that, since the injection mold of the present invention is adopted with an improved solution to fix the plate for positioning in the injection mold by extending the ring-shaped flange and the fixing pins upwardly and downwardly, after injection molding, comparing to the traditional solution mentioned above to fix an element for positioning in the injection mold by extending two sets of the pen-like pins upwardly and downwardly respectively, the traditional solution may remain depressed holes on the two opposite surfaces of the finished handle, the circled fillister 540 of the present invention remained by the ring-shaped flange provides a better solution of appearance artistic.

Therefore, using the ring-shaped flange and the fixing pins extending upwardly and downwardly to fix the plate in the injection mold not only achieves a position purpose in the injection mold, but also prevents from leaving bad looking holes on two opposite surface of the final injection molding object 700.

In one embodiment of the present invention, the material of the mentioned plastic body 710 for example can be low density polyethylene (LDPE), thermoplastic rubber (TPR), Polyvinylchloride (PVC), thermoplastic polyurethane (TPU) or combination thereof.

In another embodiment of the present invention, the plate are not respectively limited to any manufacturing method, for example, made by injection molding, and the material of the plate can be high density polyethylene (HDPE), Polypropylene (PP), Acrylonitrile Butadiene Styrene (ABS), NYLON or combination thereof.

In one of the variations of the embodiment of the present invention, the mentioned injection molding object 700 for example can be a handle or a belt etc. for equipping on a notebook. Thus, the surface of the protrusive plane 510 of the plate 500 exposed outwardly from the first plastic portion 711 can be provided as a panel for writing. In a detailed embodiment, a melting point of the plastic body is lower than a melting point of the plate and the coupling elements. In another detailed embodiment, the hardness of the plastic body is lower than the hardness of the plate and the coupling elements.

Although the present invention has been described with reference to the preferred embodiments thereof, it is apparent to those skilled in the art that a variety of modifications and changes may be made without departing from the scope of the present invention which is intended to be defined by the appended claims.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. An injection molding object comprising:
    a plastic body comprising:
        a first plastic portion having a lengthwise shape, and provided with an exposing opening at one surface thereof;
        two second plastic portions having a lengthwise shape, and respectively disposed at two opposite ends of the first plastic portion, and extended reversely with each other, wherein each of the second plastic portions is provided with two slits on two opposite lengthwise sides of the second plastic portion, respectively;
    a plate embedded in the first plastic portion, comprising:
        a protrusive plane disposed on one surface of the plate, and exposed outwardly from the first plastic portion through the exposing opening;
        a circled fillister surrounding the protrusive plane, and arranged between the protrusive plane and the first plastic portion, and exposed outwardly from the first plastic portion through the exposing opening; and
    two coupling elements respectively implanted in the two second plastic portions, each of the coupling elements comprising:
        a lug disposed at one end of the coupling element, and exposed outwardly from one free end of the second plastic portion; and
        two exposed parts respectively exposed outward the second plastic portion through the slits.

2. The injection molding object according to claim 1, wherein the plate further comprises:
    a plurality of plastic-attaching portions respectively arranged separately on edges of the surface of the plate where the protrusive plane locates, and the plastic-attaching portions attaching with the first plastic portion.

3. The injection molding object according to claim 1, wherein the plate further comprises:
    a plurality of holding depressions arranged on the surface of the plate opposite to the protrusive plane.

4. The injection molding object according to claim 1, wherein a melting point of the plastic body is lower than a melting point of the plate and the coupling elements.

5. The injection molding object according to claim 1, wherein the hardness of the plastic body is lower than the hardness of the plate and the coupling elements.

6. The injection molding object according to claim 1, wherein the material of the plastic body is selected from a group consisted of low density polyethylene (LDPE), thermoplastic rubber (TPR), Polyvinylchloride (PVC), and thermoplastic polyurethane (TPU).

7. The injection molding object according to claim 1, wherein the material of the coupling elements and the plate is selected from a group consisted of high density polyethylene (HDPE), Polypropylene (PP), Acrylonitrile Butadiene Styrene (ABS) and NYLON.

8. The injection molding object according to claim 1, wherein the coupling element is made of metal.

9. The injection molding object according to claim 1, wherein the injection molding object is a handle.

\* \* \* \* \*